(12) United States Patent
Fu et al.

(10) Patent No.: US 10,741,553 B2
(45) Date of Patent: Aug. 11, 2020

(54) METHOD OF MAKING A HIGH SPEED SEMICONDUCTOR DEVICE

(71) Applicant: TAIWAN SEMICONDUCTOR MANUFACTURING COMPANY, LTD., Hsinchu (TW)

(72) Inventors: Shu Fang Fu, Xinpu Township (TW); Chi-Feng Huang, Zhubei (TW); Chia-Chung Chen, Keelung (TW); Victor Chiang Liang, Hsinchu (TW); Fu-Huan Tsai, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/586,273

(22) Filed: Sep. 27, 2019

(65) Prior Publication Data

US 2020/0027878 A1    Jan. 23, 2020

Related U.S. Application Data

(62) Division of application No. 15/255,370, filed on Sep. 2, 2016, now Pat. No. 10,431,582.

(Continued)

(51) Int. Cl.
*H01L 27/088* (2006.01)
*H01L 27/02* (2006.01)
(Continued)

(52) U.S. Cl.
CPC .. *H01L 27/0886* (2013.01); *H01L 21/823807* (2013.01); *H01L 21/823821* (2013.01);
(Continued)

(58) Field of Classification Search
CPC .......... H01L 29/0847; H01L 29/41775; H01L 29/41791; H01L 29/66545;
(Continued)

(56) References Cited

U.S. PATENT DOCUMENTS 5,019,520 A * 5/1991 Komori ................ H01L 29/105
257/E29.055
5,759,901 A * 6/1998 Loh .................... H01L 21/26586
438/305

(Continued)

OTHER PUBLICATIONS

Office Action dated Jun. 14, 2018 from related U.S. Appl. No. 15/468,880.

*Primary Examiner* — Mark W Tornow
*Assistant Examiner* — Priya M Rampersaud
(74) *Attorney, Agent, or Firm* — Hauptman Ham, LLP

(57) ABSTRACT

A method includes forming a gate structure, a first edge structure and a second edge structure on a semiconductor strip. The method includes forming a first source/drain feature between the gate structure and the first edge structure; and a second source/drain feature between the gate structure and the second edge structure. A distance between the gate structure and the first source/drain feature is from about 1.5 to about 4.5 times greater than a distance between the gate structure and the second source/drain feature. The method includes implanting a buried channel in the semiconductor strip. A top surface of the buried channel is spaced from a top surface of the semiconductor strip. A bottom surface of the buried channel is closer to the top surface of the semiconductor strip than a bottom surface of the first source/drain feature. A dopant concentration of the buried channel is highest under the gate structure.

20 Claims, 4 Drawing Sheets

Related U.S. Application Data

(60) Provisional application No. 62/343,735, filed on May 31, 2016.

(51) Int. Cl.
*H01L 27/092* (2006.01)
*H01L 29/10* (2006.01)
*H01L 29/78* (2006.01)
*H01L 21/8238* (2006.01)
*H03K 3/03* (2006.01)

(52) U.S. Cl.
CPC ........ *H01L 21/823871* (2013.01); *H01L 21/823878* (2013.01); *H01L 27/0207* (2013.01); *H01L 27/092* (2013.01); *H01L 27/0924* (2013.01); *H01L 29/1041* (2013.01); *H01L 29/785* (2013.01); *H01L 29/7835* (2013.01); *H01L 21/823814* (2013.01); *H03K 3/0315* (2013.01)

(58) Field of Classification Search
CPC ......... H01L 29/66636; H01L 29/66795; H01L 29/785; H01L 21/823807; H01L 21/823814; H01L 21/823821; H01L 21/823871; H01L 21/823878; H01L 27/0207; H01L 27/0886; H01L 27/092; H01L 27/0924; H01L 29/1041; H01L 29/7835

See application file for complete search history.

(56) References Cited

U.S. PATENT DOCUMENTS

| | | | |
|---|---|---|---|
| 8,748,270 B1* | 6/2014 | Shifren | H01L 29/66659 257/E21.443 |
| 9,076,869 B1 | 7/2015 | Hu et al. | |
| 9,859,386 B2 | 1/2018 | Ho | |
| 2013/0193526 A1 | 8/2013 | Lo | |
| 2013/0214357 A1 | 8/2013 | Chang | |
| 2014/0008733 A1* | 1/2014 | Shrivastava | H01L 21/823807 257/401 |
| 2014/0057405 A1* | 2/2014 | Zhou | H01L 29/7816 438/286 |
| 2014/0273347 A1 | 9/2014 | Tseng | |
| 2014/0346574 A1 | 11/2014 | Cai et al. | |
| 2015/0311342 A1 | 10/2015 | Lin | |
| 2016/0118462 A1 | 4/2016 | Tseng et al. | |
| 2016/0141423 A1 | 5/2016 | Diaz | |
| 2016/0260669 A1 | 9/2016 | Paak | |

* cited by examiner

METHOD OF MAKING A HIGH SPEED SEMICONDUCTOR DEVICE

PRIORITY CLAIM

The present application is a divisional of U.S. application Ser. No. 15/255,370, filed Sep. 2, 2016, which claims the priority of U.S. Patent No. 62/343,735, filed May 31, 2016, which are incorporated herein by reference in their entireties.

BACKGROUND

Radio frequency (RF) circuits, such as voltage controlled oscillators ("VCOs"), low noise amplifiers ("LNAs"), and phase locked loops ("PLLs"), are widely used in wireless communication systems. Various RF circuits that operate at high frequencies, for example, in gigahertz (GHz) frequency ranges, are integrated with other devices to form a system. In some instances, the RF circuit is applied to a microwave or millimeter-wave (mmW) apparatus, which usually refers to a device capable of transmitting signals at a frequency approximately 10 GHz to 300 GHz.

In some approaches, the frequency is achieved by thinning a gate dielectric or shallowing a source/drain region. In some embodiments, in order to obtain a lower resistance-capacitance (RC) time constant, a sheet resistance of the gate electrode is reduced. In some approaches, the device is formed to include asymmetric lightly-doped drain (LDD) regions.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of various features in the drawings may be arbitrarily increased or reduced for clarity of discussion.

DETAILED DESCRIPTION

Figure 1A:
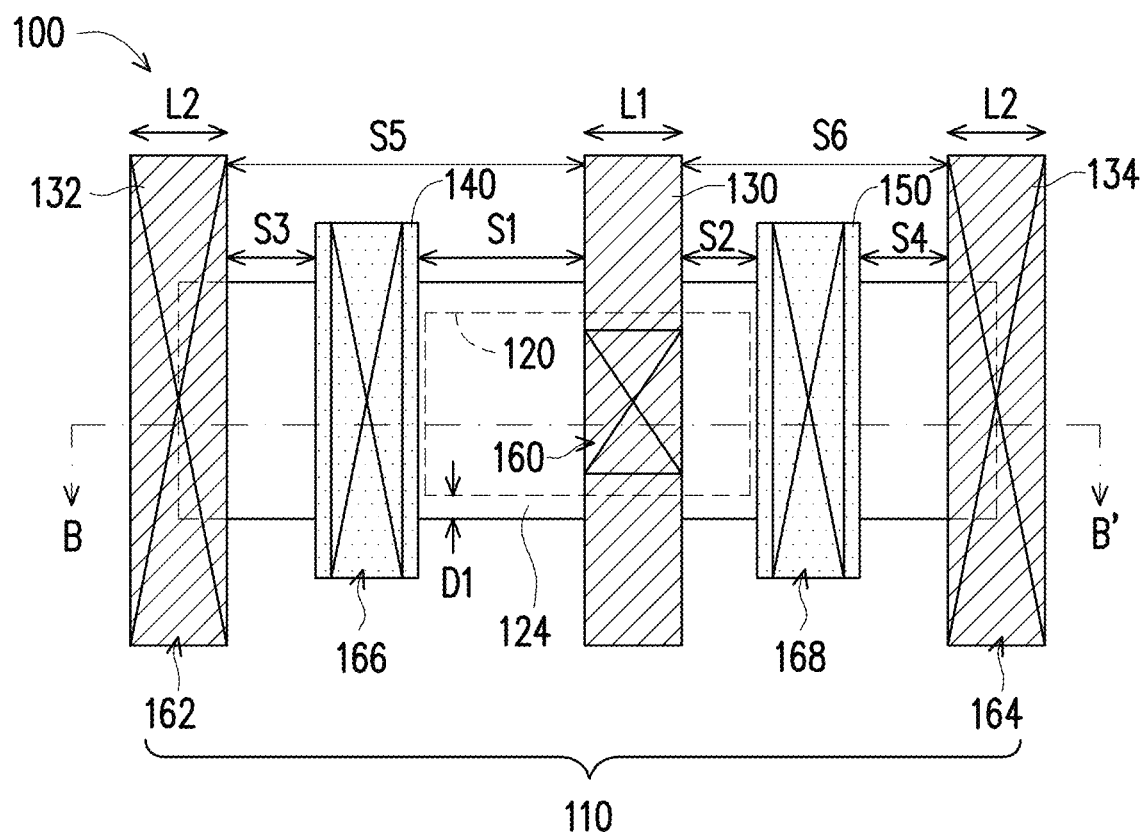
FIG. 1A is a top view of a semiconductor device in accordance with one or more embodiments.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Advances in complimentary metal-oxide-semiconductor (CMOS) technology have allowed for reduction in device feature sizes, increases in high IC densities, and an implementation of devices with high processing speeds of applications in a GHz range. However, with smaller process geometries, some parasitic capacitances such as gate-to-contact capacitance (Cco) or gate-to-source/drain fringe capacitance (Cf), even gate-to-metal capacitance have become increasingly important. CMOS devices have become more sensitive to the layout environment and have a significant impact to a circuit performance. For example, due to the Miller effect and the formation of wiring slot contacts of local interconnects, the magnitude of Cco increases by at least two times compared to previous technology, in some instances, accounting for an increasing proportion of time delay and resulting in degradation of the circuit speed. The mismatched performance of these enlarged parasitic capacitances impacts an accuracy of the resulting signal. Reducing parasitic capacitances helps CMOS devices to function within operating parameters/tolerances.

Parasitic capacitances cause various detrimental effects in a designed IC, such as undesired time delays. Thus, reducing the impact of these parasitic capacitances on the performance of the designed IC helps to maintain a high density of interconnects with less delay variation in the circuit performance. In some approaches, by shrinking the gate structure, a magnitude of conductance is increased, thereby decreasing time delay. In some approaches, a channel region is doped to be displaced away from surfaces of a fin to reduce imperfections at the surfaces, which minimizes undesired noise. In some approaches, by extending a distance between a gate structure and at least one of the source/drain features, a magnitude of Cf, Cco and Cm are reduced, resulting in a shorter signal delay in comparison with devices without the extended distance. The source/drain feature is kept in a minimum design rule so that an area of the asymmetric arrangement is maintained as small as possible to reduce an overall size of the designed IC.

FIG. 1A is a top view of a semiconductor device 100 in accordance with one or more embodiments. Semiconductor device 100 includes a semiconductor strip 110, a buried channel region 120 in semiconductor strip 110, a gate structure 130, a first edge structure 132, a second edge structure 134, a first source/drain feature 140 and a second source/drain feature 150, and contact structures 160, 162, 164, 166, 168. Buried channel region 120 is separated from side wall surfaces of semiconductor 110 at a first distance D1. First source/drain feature 140 is formed between gate structure 130 and first edge structure 132, and second source/drain feature 150 is formed between gate structure 130 and second edge structure 134. Gate structure 130 has a first length L1. Each of first edge structure 132 and second edge structure 134 has a second length L2. A first spacing S1 is defined between gate structure 130 and first source/drain feature 140. A second spacing S2 is defined between gate structure 130 and second source/drain feature 150. A third spacing S3 is defined between first source/drain feature 140 and first edge structure 132. A fourth spacing S4 is defined between second source/drain feature 150 and second edge structure 134. A fifth spacing S5 is defined between gate structure 130 and first edge structure 132. A sixth spacing S6 is defined between gate structure 130 and second edge structure 134. In some embodiments, semiconductor device 100 is formed using design rules, such as a minimum spacing rule between adjacent components and/or a minimum length rule for various components. For example, second spacing S2, third spacing S3 and fourth spacing S4 follow the minimum spacing rule under the design rules. In some embodiments, fifth spacing S5 is different from sixth spacing S6. In some embodiments, a ratio of first spacing S1 to second spacing S2 ranges from about 2:1 to about 4:1. In some embodiments, the ratio of first spacing S1 to second spacing S2 ranges from about 2.5:1 to about 3.5:1. In some embodiments, the ratio of first spacing S1 to second spacing S2 is 3:1. If the ratio of first spacing S1 to second spacing S2 is too high, then semiconductor device 100 will occupy more area and a size of semiconductor device 100 is increased, in some instances. If the ratio of first spacing S1 to second spacing S2 is too low, then semiconductor device 100 will have a slow operating time, in some instances.

Figure 1B:
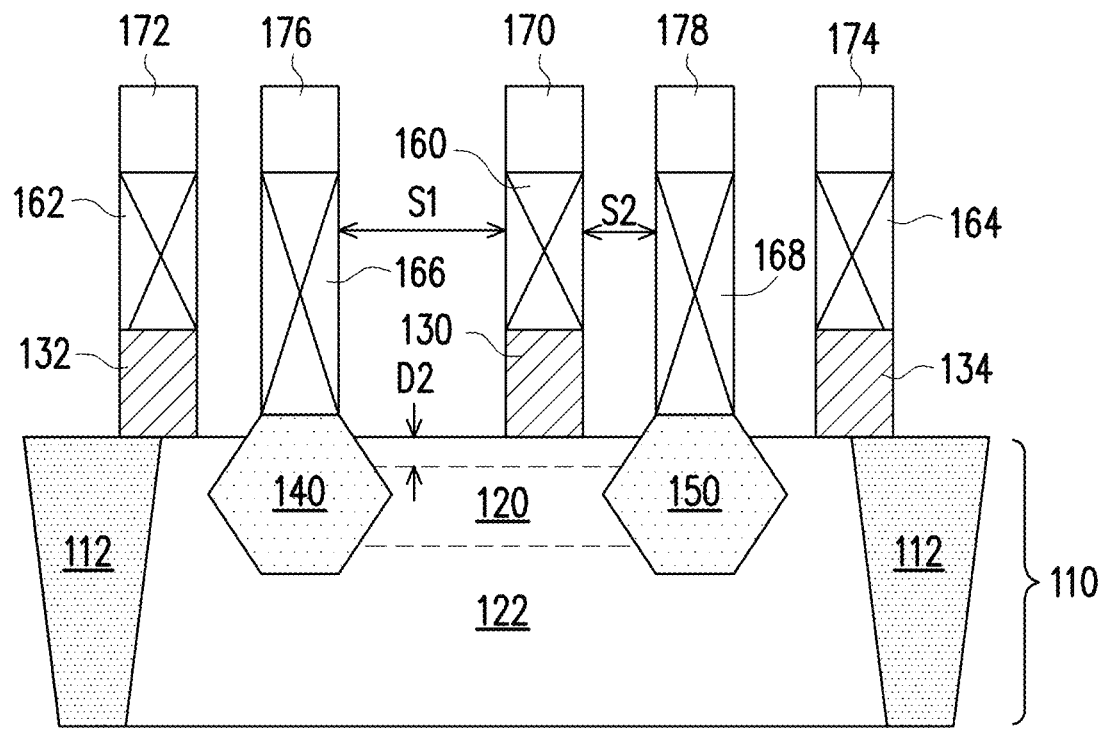
FIG. 1B is a cross-sectional view of the semiconductor device taken along line B-B' in FIG. 1A in accordance with one or more embodiments.

FIG. 1B is a cross-sectional view of semiconductor device 100 taken along line B-B' in FIG. 1A in accordance with one or more embodiments. Semiconductor device 100 further includes isolating features 112, a well region 122, an oxide definition (OD) 124, contact structures 160, 162, 164, 166, 168, and first metal line layers 170, 172, 174, 176, 178. Contact structure 160 is on gate structure 130. Contact structures 162 and 164 are on first edge structure 132 and second edge structure 134, respectively. Contact structures 166 and 168 are on first source/drain feature 140 and second source/drain feature 150, respectively. First metal line layers 170, 172, 174, 176, 178 correspond to contact structures 160, 162, 164, 166, 168, respectively. In some embodiments, contact structures 160, 162, 164, 166, 168 are contact plugs. In some embodiments, contact structures 160, 162, 164, 166, 168 are slot contacts. In some embodiments, at least one of gate structure 130, first edge structure 132 or second edge structure 134 is free of a contact structure.

In some embodiments, semiconductor device 100 includes a substrate (not shown) and a semiconductor strip 110. In some embodiments, semiconductor strip 110 is called a fin and is part of a fin field effect transistor (FinFET). Semiconductor strip 110 extends above the substrate. In some embodiments, the substrate and semiconductor strip 110 are made of a same material. For example, the substrate is a silicon substrate. In some instances, the substrate includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some instances, the substrate is a silicon on insulator (SOI) layer substrate or a silicon on sapphire (SOS) substrate. In some embodiments, the substrate and semiconductor strip 110 are made of different materials. In some embodiments, semiconductor 100 is free of semiconductor strip 110, thereby each component is formed on a planar top surface of the substrate. Semiconductor strip 110 is surrounded by isolating features 112, which are also called insulating features. Isolating features 112 electrically isolate OD 124 of semiconductor device 100 from other ODs. Isolating features 112 are shallow trench isolation (STI), field oxide (FOX), or other suitable electrically insulating structures. In some instances, the formation of isolating regions 112 includes a photolithography process, an etch process to form trenches in semiconductor strip 110 or the substrate, and a deposition process to fill the trenches with one or more dielectric materials. In some embodiments, the formation of isolating features 112 includes another STI procedure or local oxidation of silicon (LOCOS).

In some embodiments, a capping oxide layer (not shown) is formed over semiconductor strip 110. In some instances, the formation of the capping oxide layer includes a thermal oxidation process. In some instances, the formation of the capping oxide layer includes a deposition process. Well region 122 is formed in semiconductor strip 110. In some embodiments, well region 122 extends into the substrate which is below isolating feature 112. Well region 122 is separated from another well region of an adjacent semiconductor device by isolating feature 112. For an n-type transistor, well region 122 is a p-well region with a p-type dopant such as boron, indium, or other suitable acceptor dopants. For a p-type transistor, well region 122 is an n-well region with an n-type dopant such as phosphorous, arsenic, antimony, or other suitable donor dopants. The formation of well region 122 includes an implantation process. In some embodiments, an anneal process is performed following the implantation process. In various embodiments, when gate structure 130 functions as a gate terminal of a transistor, semiconductor device 100 is free of well region 122.

Buried channel region 120 is formed in semiconductor strip 110 by an inhomogeneous implantation process. For the n-type transistor, buried channel region 120 is doped with a p-type dopant, such as boron, indium, or other suitable acceptor dopants. For the p-type transistor, buried channel region 120 is doped with an n-type dopant, such as phosphorus, arsenic, or other suitable donor dopants. Buried channel region 120 is formed below gate structure 130 and between first source/drain feature 140 and second source/drain feature 150. In some embodiments, a center portion of buried channel region 120 has a higher dopant concentration than end portions of buried channel region 120. The dopant concentration of buried channel region 120 has a Gaussian distribution along directions perpendicular to a longitudinal axis of semiconductor strip 110. In at least one embodiment, a highest dopant concentration of buried channel region 120 is in a portion of buried channel region 120 below gate structure 130. In at least one embodiment, a highest concentration of buried channel region 120 ranges from about $1.7E18$ $cm^{-3}$ to about $2.0E20$ $cm^{-3}$. If the concentration is too high or too low, then threshold voltage (Vt) will vary and result in a greater variation in process variations/corners making the manufacturing process less predictable. Buried channel region 120 is formed in the interior of semiconductor strip 110 away from surfaces of semiconductor strip 110. In some embodiments, buried channel region 120 is separated from a top surface of semiconductor strip 110 at a second distance D2. In some embodiments, first distance D1 and second distance D2 independently range from about 2 nanometers (nm) to about 7 nm. If first distance D1 or second distance D2 is too short, then flicker noise level will increase. If first distance D1 or second distance D2 is too long, then a short channel effect will increase, in some instances. For a gate voltage (Vg) between about Vt to about Vt+0.2 volt (V), a current density is maximized at the center portion of semiconductor strip 110, and the current mainly flows near center portion of semiconductor strip 110 and away from the surfaces of the semiconductor strip 110. In this regime, semiconductor device 100 exhibits low flicker noise level. In some embodiments, semiconductor device 100 has a core voltage or an I/O voltage. For example, in some embodiments, the core voltage is approximately from 0.8 V to 1.05V. For example, in some embodiments, the I/O voltage is 1.6V, 2.5V or 3.3V. In some embodiments, buried channel region 120 includes silicon germanium or III-V semiconductor materials. The formation of buried channel region 120 includes a photolithography process, an implantation process and an annealing process.

Gate structure 130, first edge structure 132 and second edge structure 134 are formed on semiconductor strip 110. In at least one embodiment, gate structure 130, first edge structure 132 and second edge structure 134 are on the top surface of the substrate when the substrate is free of semiconductor strip 110. Gate structure 130 is on completely on semiconductor strip 110 and between first edge structure 132 and second edge structure 134. First edge structure 132 and second edge structure 134 are partially on semiconductor strip 110 and partially on isolating regions 112. First edge structure 132 and second edge structure 134 do not function as gate terminals of a transistor, but are used to protect edges of semiconductor device 100. In some embodiments, multiple gate structures 130 are between first edge structure 132 and second edge structure 134. In some embodiments, first edge structure 132 and second edge structure 134 independently include dummy structures. In some embodiments, first edge structure 132 and second edge structure 134 are completely on isolating regions 112. Gate structure 130 is over well region 122. In some embodiments, when well region 122 extends into the substrate below isolating feature 112, first edge structure 132 and second edge structure 134 are also over well region 122; and gate structure 130, fist source/drain region 140 and second source/drain region 150 share well region 122. In some embodiments, gate structure 130, first edge structure 132 and second edge structure 134 are formed by a gate-first methodology. In some embodiments, in order to increase a 1/gm requency, first length L1 of gate structure 130 is decreased by about 1% to 3% than the minimum length rule under the design rules. For example, first length L1 of gate structure 130 is decreased through a masking layer formed using an optical proximity correction (OPC) process. If first length L1 is decreased too much, then a manufacturing process will be difficult to control, in some instances. If first length L1 is not sufficiently decreased, then an intended functionality will fail, in some instances. While first length L1 is decreased, in some instances, second length L2 of first edge structure 132 and second edge structure 134 follow the minimum length rule under the design rules. In some embodiments, the dummy structures are formed in a gate-last methodology or a hybrid process of gate-last and gate-first methodologies.

In some embodiments, in a gate-last methodology, also called a replacement gate methodology, each of gate structure 130, first edge structure 132 and second edge structure 134 are replaced from a dummy poly structure (not shown). The dummy poly structures, which are also called sacrificial poly structures, are initially formed on a same location as gate structure 130, first edge structure 132 and second edge structure 134, and are subsequently removed and replaced with one or more materials.

In some embodiments, dummy poly structures include a gate dielectric and/or a gate electrode. For example, the gate dielectric is silicon dioxide. In some embodiments, the silicon dioxide is a thermally grown oxide. In some embodiments, the gate dielectric is a high dielectric constant (high-k) dielectric material. A high-k dielectric material has a dielectric constant higher than that of silicon dioxide. In some embodiments, the gate electrode includes polycrystalline-silicon (poly-Si), poly-crystalline silicon-germanium (poly-SiGe), metallic nitride, metallic silicide, metallic oxide, metal, and/or other suitable layers. The formation of the gate electrode includes a deposition process and a subsequent etch process. In some embodiments, the dummy poly structures further include a hard mask layer over the gate electrode. Spacers (not shown) are along sidewalls of the dummy poly structures. The spacers include a dielectric material such as silicon oxide, silicon nitride, silicon oxynitride, silicon carbide, or combinations thereof. The formation of the spacers includes a procedure including deposition and etch back processes. In some embodiments, the spacers include an oxide-nitride-oxide (ONO) structure in some embodiments. In various embodiments, the spacers are patterned by performing an isotropic or an anisotropic etch process to form a D-shaped, I-shaped, or L-shaped spacers.

First source/drain feature 140 and second source/drain feature 150 are formed on opposite sides of gate structure 130. First source/drain feature 140 is between gate structure 130 and first edge structure 132; and second source/drain feature 150 is between gate structure 130 and second edge structure 134. In at least one embodiment, first source/drain feature 140 and second source/drain feature 150 are in well region 122 and buried channel region 120 is between first source/drain feature 140 and second source/drain feature 150. In some embodiments, second spacing S2, third spacing S3 and fourth spacing S4 follow the minimum spacing rule under the design rules. First spacing S1 is longer than second spacing S2 to form an asymmetric structure. In some embodiments, first source/drain feature 140 is a source terminal and second source/drain feature 150 is a drain terminal in a transistor. In some embodiments, first source/drain feature 140 is a drain terminal and second source/drain feature 150 is a source terminal in a transistor. Because a distance between gate structure 130 and first source/drain feature 140, i.e., first spacing S1, is longer than a distance between gate structure 130 and second source/drain feature 150, i.e., second spacing S2, a parasitic capacitance Cf will be reduced. For example, first spacing S1 is about three times greater than second spacing S2, in some embodiments. Fifth spacing S5 is longer than sixth spacing S6 so that a poly pitch between gate structure 130 and first edge structure 132 is longer than a poly pitch between gate structure 130 and second edge structure 134. In one or more embodiments, a ratio of first spacing S1 to second spacing S2 ranges from about 1.5 to about 4.5. If the ratio is too large, then semiconductor device 100 will occupy more area and a size of semiconductor device 100 is increased, in some instances. If the ratio is too small, then a functionality of semiconductor device 100 will fail, in some instances. In some embodiments, second spacing S2 is slightly longer than the minimum spacing rule while third spacing S3 and fourth spacing S4 still follow the minimum spacing rule. In some embodiments, semiconductor device 100 operates in a cutoff frequency higher than 350 GHz.

Portions of semiconductor strip 110 are removed to form recesses (not shown) adjacent to the dummy poly structure. Recesses are entirely within semiconductor strip 110. In some embodiments, when the substrate is free of semiconductor strip 110, recesses are formed by removing portions of the substrate. A filling process is subsequently performed by filling the recesses with one or more semiconductor materials. The formation of the recesses includes an etch process, such as a wet etching or a dry etching. In some embodiments, the filling process is performed by an epitaxial (epi) process. In some embodiments, first source/drain feature 140 and second source/drain feature 150 are independently formed using an implantation process. In some embodiments, first source/drain feature 140 and second source/drain feature 150 are formed in a hybrid procedure of epi process and implantation process. For example, first source/drain feature 140 and second source/drain feature 150 are grown by the epi process. P-type transistors include an implantation process with a P+ ion dopant to form source/drain feature 140 and second source/drain feature 150. N-type transistors do not include an implantation process with an N− ion dopant. Semiconductor device 100 is free of lightly-doped drain (LDD) region.

After the formation of first source/drain feature 140 and second source/drain feature 150, the gate dielectric and the gate electrode are removed from the dummy poly structures to form an opening in some embodiments which include a gate-last process. In some embodiments, the gate electrode is removed while the gate dielectric remains on the top surface of semiconductor strip 110. Gate structure 130 includes a first dielectric portion over semiconductor strip 110. In some instances, the first dielectric portion is called an interfacial layer. Gate structure 130 further includes a second dielectric portion over the first dielectric portion. In some instances, the second dielectric portion is called a gate dielectric layer. The second dielectric portion has a U-shape or a rectangular shape. A conductive material is over the second dielectric portion. In some embodiments, the conductive material is tungsten. In some embodiments, the conductive material includes different materials such as titanium, nickel, or tantalum, and has a work function suitable for a p-type transistor or an n-type transistor. When the second dielectric portion has the rectangular shape, the conductive material contacts the spacers. When the second dielectric portion has a U shape, the second dielectric portion separates the conductive material form the spacers. In some embodiments, a capping layer is over the conductive material.

Contact structures 160, 162, 164, 166, 168 couple to gate structure 130, first edge structure 132, second edge structure 134, first source/drain feature 140, and second source/drain feature 150, respectively. In some embodiments, contact structures 160, 162, 164, 166, 168 are contact plugs. In some embodiments, contact structures 160, 162, 164, 166, 168 are slot contacts that function as interconnects for semiconductor device 100. When contact structures 160, 162, 164, 166, 168 are slot contacts, a via is between first source/drain feature 140 and contact structure 166, in some instances. When first spacing S1 is three times greater than second spacing S2, a distance between gate structure 130 and contact structure 166 is also three times greater than a distance between gate structure 130 and contact structure 168, thereby decreasing parasitic capacitance Cco. If the ratio is too large, then semiconductor device 100 will occupy more area and a size of semiconductor device 100 is increased, in some instances. If the ratio is too small, then a functionality of semiconductor device 100 will fail, in some instances. Contact structures 160, 162, 164, 166, 168 include a conductive portion and a liner portion. The conductive portion is laterally surrounded by the liner portion. First metal line layers 170, 172, 174, 176, 178 couple to contact structures 160, 162, 164, 166, 168, respectively. When contact structures 160, 162, 164, 166, 168 are slot contacts, semiconductor device 100 is free of first metal line layers 170, 172, 174, 176, 178; and via plugs are on each of contact structures 160, 162, 164, 166, 168 are slot contacts. When first spacing S1 is three times greater than second spacing S2, a distance between gate structure 130 and first metal line layer 176 is also three times greater than a distance between gate structure 130 and second metal line layer 178, thereby decreasing parasitic capacitance Cm. In such an asymmetric arrangement, parasitic capacitances Cf, Cco and Cm are reduced and a speed of semiconductor device 100 is enhanced. If the ratio is too large, then semiconductor device 100 will occupy more area and a size of semiconductor device 100 is increased, in some instances. If the ratio is too small, then a functionality of semiconductor device 100 will fail, in some instances.

Figure 2A:
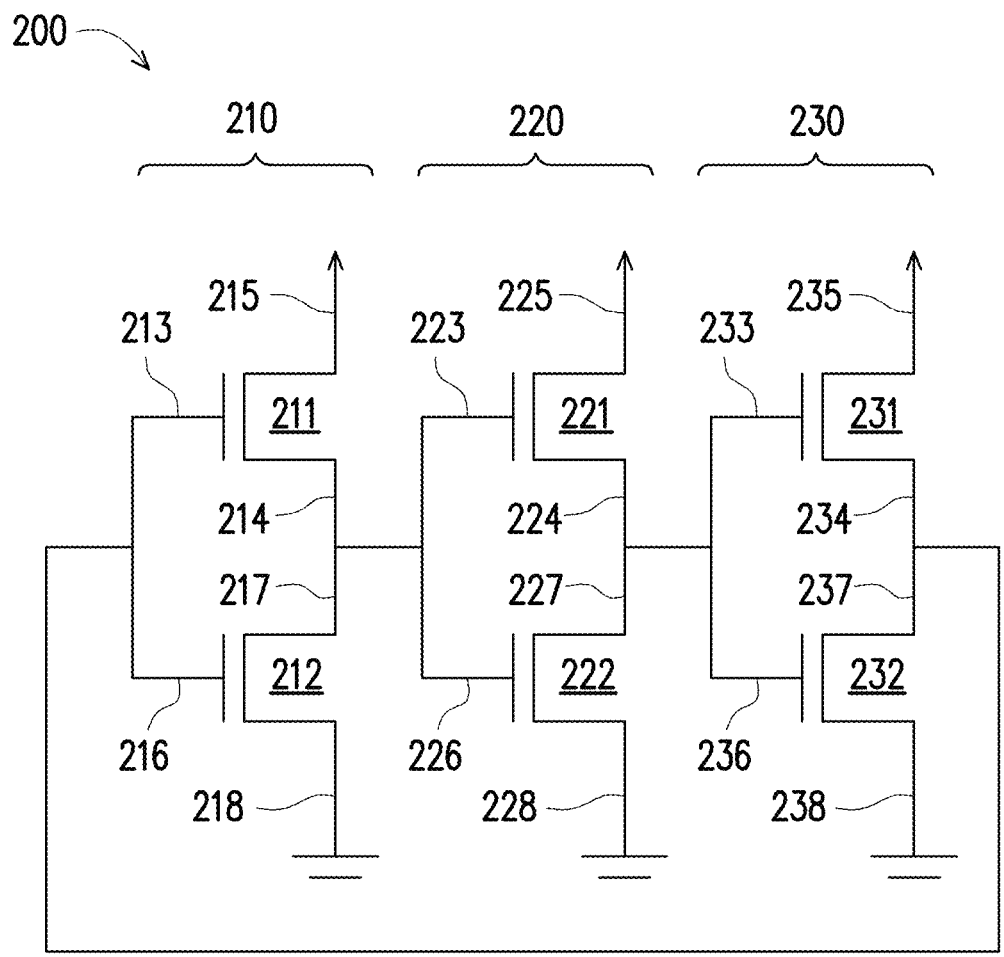
FIG. 2A is a schematic diagram of a ring oscillator including a semiconductor device in accordance with one or more embodiments.

FIG. 2A is a schematic diagram of a ring oscillator 200 including a semiconductor device in accordance with one or more embodiments. In some embodiments, the semiconductor device is semiconductor device 100 (FIG. 1A). Ring oscillator 200 includes a first invertor 210, a second invertor 220 and a third invertor 230. In some embodiments, ring oscillator 200 includes more than three inverters, as long as there are an odd number of inverters, i.e., a NOT gate. In digital logic, a NOT gate implements logical negation. First invertor 210 includes a first p-type transistor 211 (also called a pull-down transistor) and a first n-type transistor 212 (also called a pull-up transistor). Second inventor 220 includes a second p-type transistor 221 and a second n-type transistor 222. Third inventor 230 includes a third p-type transistor 231 and a third n-type transistor 232. First p-type transistor 211 includes a gate terminal 213, a drain terminal 214 and a source terminal 215. First n-type transistor 212 includes a gate terminal 216, a drain terminal 217, and a source terminal 218. Gate terminal 213 couples to gate terminal 216, and drain terminal 214 couples drain terminal 217. Second p-type transistor 221 includes a gate terminal 223, a drain terminal 224 and a source terminal 225. Second n-type transistor 222 includes a gate terminal 226, a drain terminal 227 and a source terminal 228. Gate terminal 223 couples to gate terminal 226, and drain terminal 224 couples drain terminal 227. Third p-type transistor 231 includes a gate terminal 233, a drain terminal 234 and a source terminal 235. Third n-type transistor 232 includes a gate terminal 236, a drain terminal 237 and a source terminal 238. Gate terminal 233 couples to gate terminal 236, and drain terminal 234 couples drain terminal 237.

Figure 2B:
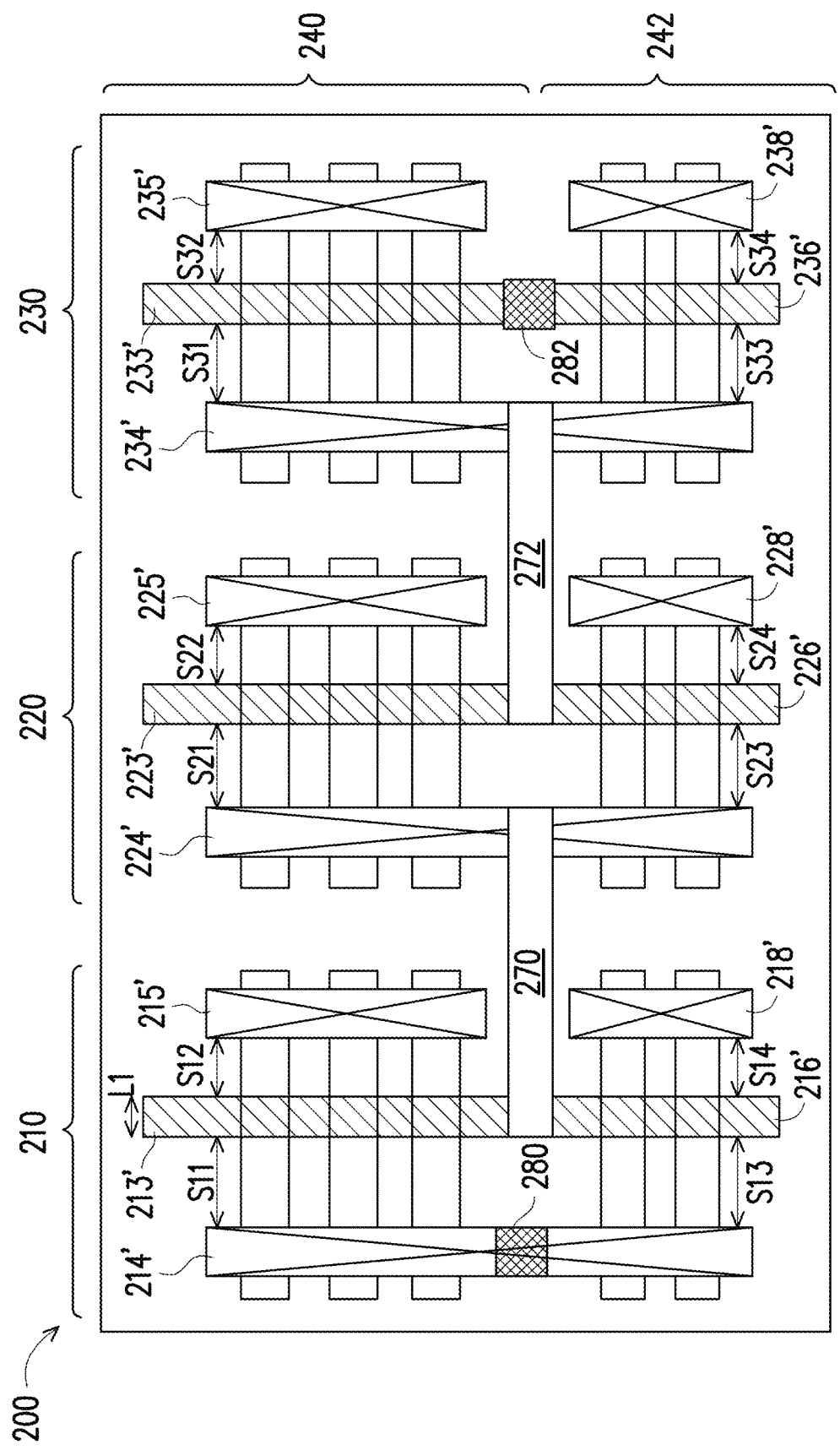
FIG. 2B is a schematic layout diagram of the ring oscillator of FIG. 2A in accordance with one or more embodiments.

FIG. 2B is a layout diagram of ring oscillator 200 in accordance with one or more embodiments. Ring oscillator 200 includes two fin active regions 240 and 242. For example, fin active region 240 is in an n-well region and fin active region 242 is in a p-well region. First inverter 210 includes a gate feature 213', a drain feature 214' and source features 215' and 216'. Second inverter 220 includes a gate feature 223', a drain feature 224' and source features 225' and 226'. Third inverter 230 includes a gate feature 233', a drain feature 234' and source features 235' and 236'. Gate feature 213' electrically couples to drain feature 224' by a connection feature 270, and gate feature 223' electrically couples to drain feature 234' by a connection feature 272. In some embodiments, drain features 224' and 234' correspond to a slot contact layer and connection features 270 and 272 correspond to a first metal layer. In some embodiments, drain features 224' and 234' correspond to the first metal layer and connection features 270 and 272 correspond to a second metal layer. Gate feature 233' electrically couples to drain feature 214' to form a ring oscillator. In some embodiments, gate feature 233' connects to drain feature 214' in the first metal layer. In some embodiments, gate feature 233' connects to drain feature 224' in the second metal layer by vias 280 and 282.

In some embodiments, in order to increase an operating speed of ring oscillator 200, a spacing between a gate feature and a drain feature is longer than a spacing between the gate feature and a source feature. In some embodiments, ring oscillator 200 includes a spacing between the gate feature and the source feature longer than the spacing between the gate feature and the drain feature. For example, spacings S11, S13, S21, S23, S31 and S33 are longer than spacings S12, S14, S22, S24, S32 and S34, respectively. In some embodiments, spacings S12-S34 follow a minimum spacing rule under the design rules and spacings S11-S33 are about three times greater than the minimum spacing rule. In some embodiments, a ratio between spacings S11-S33 to spacings S12-S34, respectively, ranges from about 1.5 to about 4.5. If the ratio is too large, then ring oscillator 200 will occupy more area. If the ratio is too small, then a functionality of ring oscillator 200 will fail, in some instances. In some embodiments, only spacings S11, S21 and S31 are extended with respect to the minimum spacing rule, while other spacings follow the minimum spacing rule. In some embodiments, only spacings S12, S22 and S32 are extended with respect to the minimum spacing rule, while other spacings follow the minimum spacing rule. In some embodiments, each of first inverter 210, second inverter 220 and third inverter 230 has a delay time less than about 76 picosecond (ps).

Figure 3:
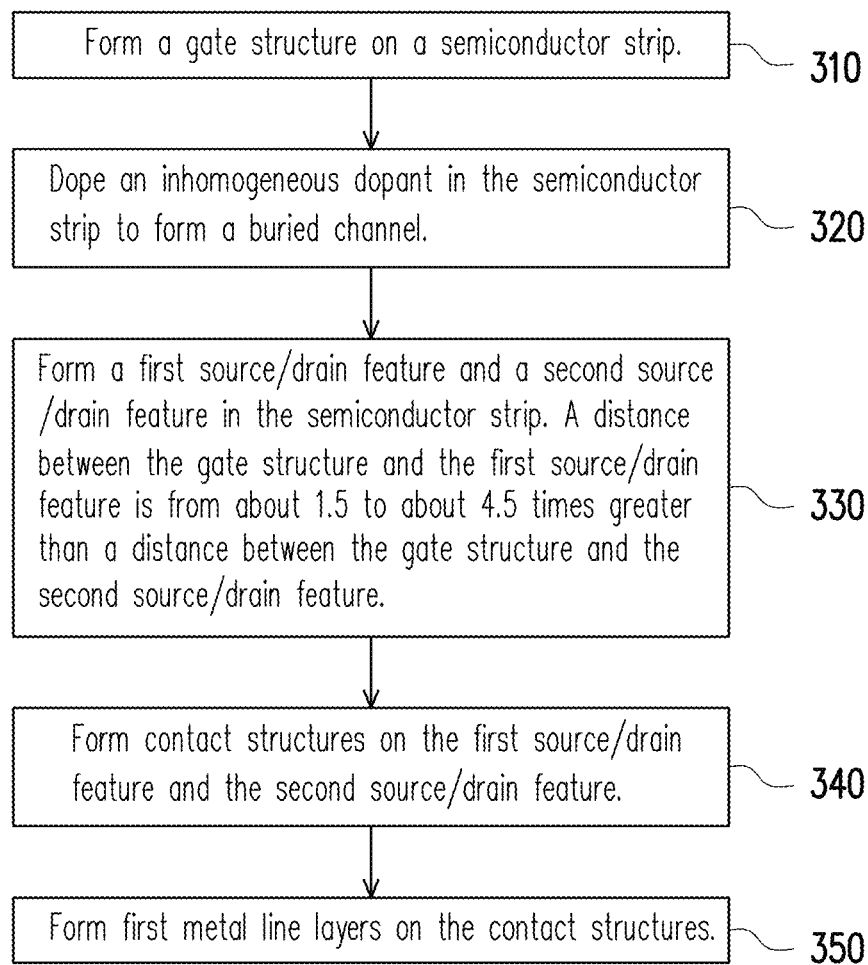
FIG. 3 is a flow chart of a method of fabricating a semiconductor device in accordance with one or more embodiments.

FIG. 3 is a flow chart of a method 300 of fabricating a semiconductor device in accordance with one or more embodiments. Method 300 includes operation 310 in which a gate structure is formed on a semiconductor strip. In some embodiments, a length of the gate structure is reduced through a masking layer formed using an OPC process. In some embodiments, the gate structure is formed on a substrate to form a planar semiconductor device.

At operation 320, an inhomogeneous dopant is doped in the semiconductor strip to form a buried channel. In some embodiments, the buried channel is separated from a top surface and side surfaces of the semiconductor strip at a distance ranging from about 2 nm to about 7 nm.

At operation 330, a first source/drain feature and a second source/drain feature are formed in the semiconductor strip, and a distance between the gate structure and the first source/drain feature is from about 1.5 to about 4.5 times greater than a distance between the gate structure and the second source/drain feature. In some embodiments, the first source/drain feature is a source terminal of a transistor and the second source/drain feature is a drain terminal of the transistor. In some embodiments, the first source/drain feature is a drain terminal of the transistor and the second source/drain feature is a source terminal of the transistor. In some embodiments, the distance between the gate structure and the second source/drain feature is kept in a minimum spacing under design rules.

At operation 340, contact structures are formed on the first source/drain feature and the second source/drain feature. In some embodiments, the contact structures are contact plugs. In some embodiments, the contact structures are slot contacts.

At operation 350, first metal line layers are formed on the contact structures. For example, first metal layers 176 and 178 are coupled to contact structures 166 and 168. When contact structures 166 and 168 are slot contacts, the semiconductor device is free of first metal layers 175 and 178.

Semiconductor devices 100 and ring oscillator 200 may undergo further processes to complete fabrication. For example, in some embodiments, a first passivation layer is formed on a topmost inter-metal dielectric layer and a second passivation layer is formed on the first passivation layer. In some embodiments, the first passivation layer and the second passivation layer independently include oxides, nitrides, and combinations thereof. Semiconductor devices 100 and ring oscillator 200 further include an aluminum ring (alternatively referred to as aluminum pad or pad ring) over, and physically connected to a topmost metal layer. The aluminum ring may include a portion over the first passivation layer and a portion penetrating into the first passivation layer. The aluminum ring is formed simultaneously with the formation of bond pads (not shown) exposed on a top surface of semiconductor devices 100 and ring oscillator 200.

An aspect of this description relates to a method of fabricating a semiconductor device. The method includes forming a gate structure, a first edge structure and a second edge structure on a semiconductor strip. The method further includes forming a first source/drain feature between the gate structure and the first edge structure. The method further includes forming a second source/drain feature between the gate structure and the second edge structure, wherein a distance between the gate structure and the first source/drain feature is from about 1.5 to about 4.5 times greater than a distance between the gate structure and the second source/drain feature. The method further includes implanting a buried channel in the semiconductor strip, wherein a top surface of the buried channel is spaced from a top surface of the semiconductor strip, a bottom surface of the buried channel is closer to the top surface of the semiconductor strip than a bottom surface of the first source/drain feature, and a dopant concentration of the buried channel is highest under the gate structure. In some embodiments, the implanting the buried channel comprises implanting the buried channel having the dopant concentration under the gate structure ranging from about $1.7E18$ $cm^{-3}$ to about $2.0E20$ $cm^{-3}$. In some embodiments, implanting the buried channel comprises implanting the buried channel at a depth from about 2 nanometers (nm) to about 7 nm below the top surface of the semiconductor strip. In some embodiments, the method further includes depositing an insulating material to form a first isolation region and a second isolation region, wherein the semiconductor strip is between the first isolation region and the second isolation region. In some embodiments, the method further includes forming the first edge structure partially overlaps the first isolation region. In some embodiments, the method further includes forming the second edge structure partially overlaps the second isolation region. In some embodiments, forming the first edge structure includes forming the first edge structure having a length in a first direction parallel to the top surface of the semiconductor strip greater than a length of the gate structure in the first direction.

An aspect of this description relates to a method of fabricating a semiconductor device. The method includes forming a gate structure, a first edge structure and a second edge structure on a semiconductor strip, wherein a distance between the gate structure and the first edge structure is different from a distance between the gate structure and the second edge structure. The method further includes forming a first source/drain feature between the gate structure and the first edge structure. The method further includes forming a second source/drain feature between the gate structure and the second edge structure, wherein a distance between the gate structure and the first source/drain feature is different from a distance between the gate structure and the second source/drain feature. The method further includes implanting a buried channel in the semiconductor strip, wherein a top surface of the buried channel is spaced from a top surface of the semiconductor strip, a bottom surface of the buried channel is closer to the top surface of the semiconductor strip than a bottom surface of the first source/drain feature, and a dopant concentration of the buried channel is highest under the gate structure. In some embodiments, forming the first source/drain feature comprises forming the first source/drain feature a same distance from the gate structure as from the first edge structure. In some embodiments, forming the second source/drain feature comprises forming the second source/drain feature closer to the second edge feature than the gate structure. In some embodiments, forming the first edge structure comprises forming the first edge structure entirely over the semiconductor strip. In some embodiments, the method further includes depositing an insulating material to define a first isolation region adjacent the semiconductor strip. In some embodiments, forming the first edge structure includes forming the first edge structure partially over the first isolation region. In some embodiments, forming the first edge structure includes forming the first edge structure entirely over the first isolation region.

An aspect of this description relates to a method of fabricating a semiconductor device. The method includes forming a dummy gate structure, a dummy first edge structure and a dummy second edge structure on a semiconductor strip. The method further includes forming a first source/drain feature between the dummy gate structure and the dummy first edge structure. The method further includes forming a second source/drain feature between the dummy gate structure and the dummy second edge structure, wherein a distance between the dummy gate structure and the first source/drain feature is different from a distance between the dummy gate structure and the second source/drain feature. The method further includes implanting a buried channel in the semiconductor strip, wherein a top surface of the buried channel is spaced from a top surface of the semiconductor strip, a bottom surface of the buried channel is closer to the top surface of the semiconductor strip than a bottom surface of the first source/drain feature, and a dopant concentration of the buried channel is highest under the dummy gate structure. The method further includes replacing the dummy gate structure with an active gate structure. In some embodiments, the method further includes replacing the dummy first edge structure with a first edge structure having a different material from the dummy first edge structure. In some embodiments, the method further includes replacing the dummy first edge structure with a first edge structure having a different material from the dummy first edge structure. In some embodiments, the method further includes forming a gate contact over the active gate structure. In some embodiments, the method further includes forming a contact structure over the dummy first edge structure. In some embodiments, forming the dummy first edge structure includes forming the dummy first edge structure at least partially over an isolation region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods, operations, and steps described in the specification. As one of ordinary skill in the art will readily appreciate from the disclosure, processes, machines, manufacture, compositions of matter, means, methods, operations, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, operations, or steps. In addition, each claim constitutes a separate embodiment, and the combination of various claims and embodiments are within the scope of the disclosure.

What is claimed is:

1. A method of fabricating a semiconductor device, the method comprising:
    forming a gate structure, a first edge structure and a second edge structure on a semiconductor strip;
    forming a first source/drain feature between the gate structure and the first edge structure;
    forming a second source/drain feature between the gate structure and the second edge structure, wherein a distance between the gate structure and the first source/drain feature is from about 1.5 to about 4.5 times greater than a distance between the gate structure and the second source/drain feature; and
    implanting a buried channel in the semiconductor strip, wherein a top surface of the buried channel is spaced from a top surface of the semiconductor strip, a bottom surface of the buried channel is closer to the top surface of the semiconductor strip than a bottom surface of the first source/drain feature, and a dopant concentration of the buried channel is highest under the gate structure.

2. The method of claim 1, wherein the implanting the buried channel comprises implanting the buried channel having the dopant concentration under the gate structure ranging from about $1.7E18$ $cm^{-3}$ to about $2.0E20$ $cm^{-3}$.

3. The method of claim 1, wherein implanting the buried channel comprises implanting the buried channel at a depth from about 2 nanometers (nm) to about 7 nm below the top surface of the semiconductor strip.

4. The method of claim 1, further comprising depositing an insulating material to form a first isolation region and a second isolation region, wherein the semiconductor strip is between the first isolation region and the second isolation region.

5. The method of claim 4, further comprising forming the first edge structure partially overlaps the first isolation region.

6. The method of claim 5, further comprising forming the second edge structure partially overlaps the second isolation region.

7. The method of claim 5, wherein forming the first edge structure comprises forming the first edge structure having a length in a first direction parallel to the top surface of the semiconductor strip greater than a length of the gate structure in the first direction.

8. A method of fabricating a semiconductor device, the method comprising:
forming a gate structure, a first edge structure and a second edge structure on a semiconductor strip, wherein a distance between the gate structure and the first edge structure is different from a distance between the gate structure and the second edge structure;
forming a first source/drain feature between the gate structure and the first edge structure;
forming a second source/drain feature between the gate structure and the second edge structure, wherein a distance between the gate structure and the first source/drain feature is different from a distance between the gate structure and the second source/drain feature; and
implanting a buried channel in the semiconductor strip, wherein a top surface of the buried channel is spaced from a top surface of the semiconductor strip, a bottom surface of the buried channel is closer to the top surface of the semiconductor strip than a bottom surface of the first source/drain feature, and a dopant concentration of the buried channel is highest under the gate structure.

9. The method of claim 8, wherein forming the first source/drain feature comprises forming the first source/drain feature a same distance from the gate structure as from the first edge structure.

10. The method of claim 8, wherein forming the second source/drain feature comprises forming the second source/drain feature closer to the second edge feature than the gate structure.

11. The method of claim 8, wherein forming the first edge structure comprises forming the first edge structure entirely over the semiconductor strip.

12. The method of claim 8, further comprising depositing an insulating material to define a first isolation region adjacent the semiconductor strip.

13. The method of claim 12, wherein forming the first edge structure comprises forming the first edge structure partially over the first isolation region.

14. The method of claim 12, wherein forming the first edge structure comprises forming the first edge structure entirely over the first isolation region.

15. A method of fabricating a semiconductor device, the method comprising:
forming a dummy gate structure, a dummy first edge structure and a dummy second edge structure on a semiconductor strip;
forming a first source/drain feature between the dummy gate structure and the dummy first edge structure;
forming a second source/drain feature between the dummy gate structure and the dummy second edge structure, wherein a distance between the gate structure and the first source/drain feature is different from a distance between the gate structure and the second source/drain feature;
implanting a buried channel in the semiconductor strip, wherein a top surface of the buried channel is spaced from a top surface of the semiconductor strip, a bottom surface of the buried channel is closer to the top surface of the semiconductor strip than a bottom surface of the first source/drain feature, and a dopant concentration of the buried channel is highest under the dummy gate structure; and
replacing the dummy gate structure with an active gate structure.

16. The method of claim 15, further comprising replacing the dummy first edge structure with a first edge structure having a different material from the dummy first edge structure.

17. The method of claim 16, further comprising replacing the dummy first edge structure with a first edge structure having a different material from the dummy first edge structure.

18. The method of claim 15, further comprising forming a gate contact over the active gate structure.

19. The method of claim 15, further comprising forming a contact structure over the dummy first edge structure.

20. The method of claim 15, wherein forming the dummy first edge structure comprises forming the dummy first edge structure at least partially over an isolation region.

* * * * *